(12) United States Patent
Kiefer (10) Patent No.: US 7,109,711 B2
(45) Date of Patent: Sep. 19, 2006

(54) MRI METHOD AND APPARATUS WITH ELIMINATION OF THE AMBIGUITY ARTIFACT

(75) Inventor: Berthold Kiefer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/865,712

(22) Filed: Jun. 10, 2004

(65) Prior Publication Data

US 2005/0001619 A1    Jan. 6, 2005

(30) Foreign Application Priority Data

Jun. 10, 2003    (DE) ................................ 103 26 174

(51) Int. Cl.
*G01V 3/00*    (2006.01)

(52) U.S. Cl. ...................................... 324/309; 324/307

(58) Field of Classification Search ................ 324/309, 324/307, 306, 300

See application file for complete search history.

(56) References Cited

U.S. PATENT DOCUMENTS

| 4,959,611 | A  | * | 9/1990  | Brovost et al. ............. 324/309 |
| 6,498,485 | B1 | * | 12/2002 | Miyosi et al. .............. 324/307 |
| 2002/0101237 | A1 |  | 8/2002 | Miyosi et al. |

OTHER PUBLICATIONS

"RARE Imaging: A Fast Imaging Method for Clinical MR," Hennig et al, Mag. Res. In Med., vol. 3 (1986) pp. 823-833.

* cited by examiner

*Primary Examiner*—Louis M. Arana
(74) *Attorney, Agent, or Firm*—Schiff Hardin LLP (57) ABSTRACT

In a method for magnetic resonance imaging, by combined switching of radio-frequency excitation pulses, slice selection gradient pulses, phase-coding gradient pulses and readout gradient pulses, a matrix in the k-space is scanned row-by-row and transformed using a Fourier transformation into a matrix in the spatial domain, with the polarity of the slice selection gradient being inverted during the scanning of the k-matrix, allowing elimination of the ambiguity artifact.

20 Claims, 7 Drawing Sheets

SE = spin echo

MRI METHOD AND APPARATUS WITH ELIMINATION OF THE AMBIGUITY ARTIFACT

BACKGROUND OF THE INVENTION

1. Field of the Invention

The present invention relates in general to magnetic resonance tomography (MRT) as used in medicine for examining patients. The present invention relates in particular to a method for preventing the ambiguity artifact, particularly when using spin-echo sequences as well as when using gradient echo sequences, but without affecting the measurement duration and the signal-to-noise ratio.

2. Description of the Prior Art

MRT is based on the physical phenomenon of nuclear magnetic resonance and has been successfully used as an imaging technique for more than 15 years in medicine and in biophysics. In this examination method, the subject is exposed to a strong, constant magnetic field. As a result, the nuclear spins of the atoms in the subject become aligned after having been previously randomly oriented. Radio-frequency energy can now excite these "ordered" nuclear spins to product a certain oscillation. In MRT, this oscillation produces the actual measurement signal which is detected using suitable receiving coils. By using non-homogeneous magnetic fields produced by gradient coils, the examination subject can be spatially coded in all three spatial directions in the respective region of interest (also known as the field of view or FOV for short), this procedure being generally known as "spatial coding."

The recording of data in MRT takes place in what is known as "k-space" (frequency domain). The MRT image in the "image" is linked thereto using a Fourier transformation with the MRT data in k-space. The spatial coding of the subject which defines the k-space takes place using gradients in all three spatial directions. The slice selection (gradient defines slice in the subject from which data will be acquired, normally along the Z axis), the frequency coding (gradient defines a direction in the slice, normally along the x axis) and the phase-coding (gradient defines the second dimension within the slice, normally the along y axis).

In other words, first a slice is excited selectively, for example, in the z direction. The coding of the spatial information in the slice takes place by combined phase and frequency coding by means of these two orthogonal gradient fields already mentioned which are produced in the example of a slice excited in the z direction by the aforementioned gradient coils in the x and y directions.

Figure 2A:
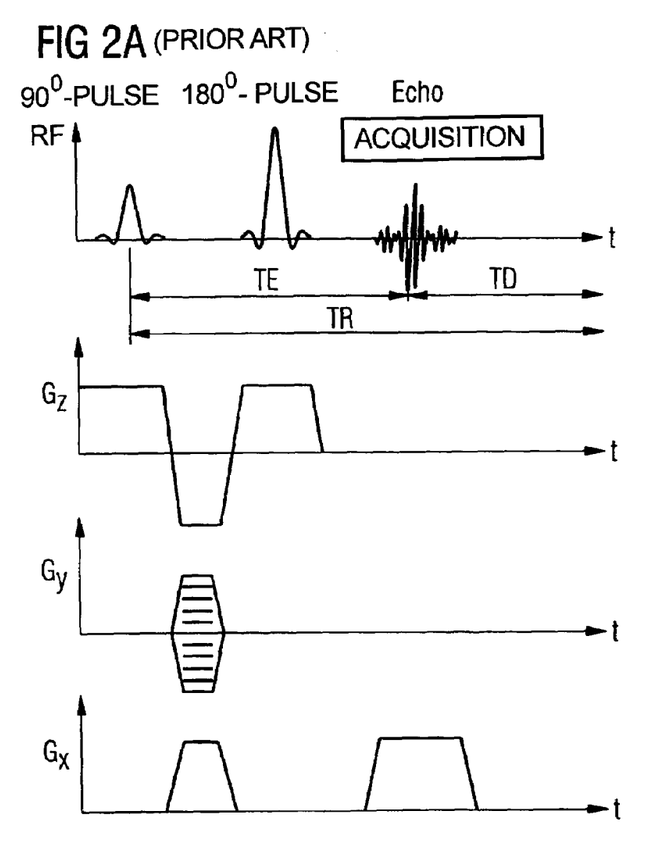
FIG. 2A schematically illustrates the known spin-echo sequence.
Figure 2B:
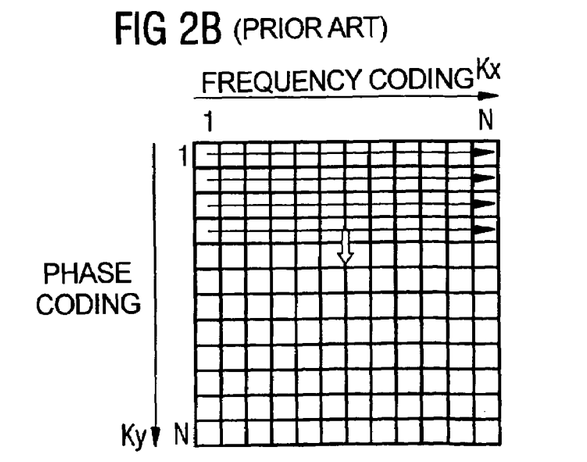
FIG. 2B schematically illustrates scanning the k-matrix in the spin-echo sequence according to FIG. 2A.

A first possible form of recording the data in an MRT exposure (measurement) is shown in FIGS. 2A and 2B. The sequence used is the known spin-echo sequence. The magnetization of the spins is flipped in the x-y plane by a 90° excitation pulse. Over the course of time, a dephasing of the magnetization components occurs, which jointly form the cross magnetization in the x-y plane $M_{xy}$. After a certain time (e.g., ½ $T_E$, where $T_E$ is the echo time), a 180° pulse is emitted in the x-y plane so that the dephased magnetization components are mirrored without changing the precession direction and precession speed of the individual magnetization components. After a further time interval of ½ $T_E$, the magnetization components again point in the same direction, i.e., a regeneration of the cross magnetization (known as "rephasing") occurs, and the magnetic resonance signal is read out. The complete regeneration of the cross magnetization is known as "spin-echo".

In order to measure an entire slice of the examination subject, the imaging sequence is repeated N times for different values of the phase-coding gradient, e.g., $G_y$, the frequency of the magnetic resonance signal (spin-echo signal) being scanned, digitized and stored for each sequence pass through the Δt-clocked ADC (analog/digital converter) N times in equidistant time steps Δt in the presence of the readout gradient $G_x$. In this manner, one obtains as shown in FIG. 2B a numerical matrix produced row-by-row (matrix in the k-space or k-matrix) having N×N data points (a symmetrical matrix with N×N points is only an example; asymmetrical matrices can also be produced). From this data set, using a Fourier transformation an MR image of the observed slice can be directly reconstructed with a resolution of N×N pixels.

Figure 3A:
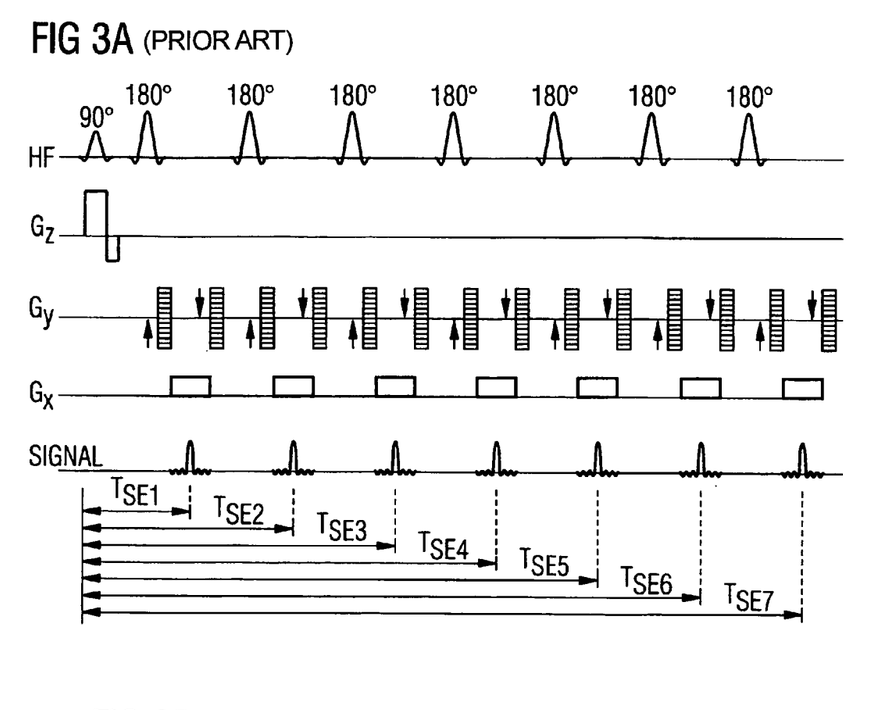
FIG. 3A schematically illustrates the known turbo spin-echo sequence (TSE or RARE sequence) in which seven spin echoes are generated.
Figure 3B:
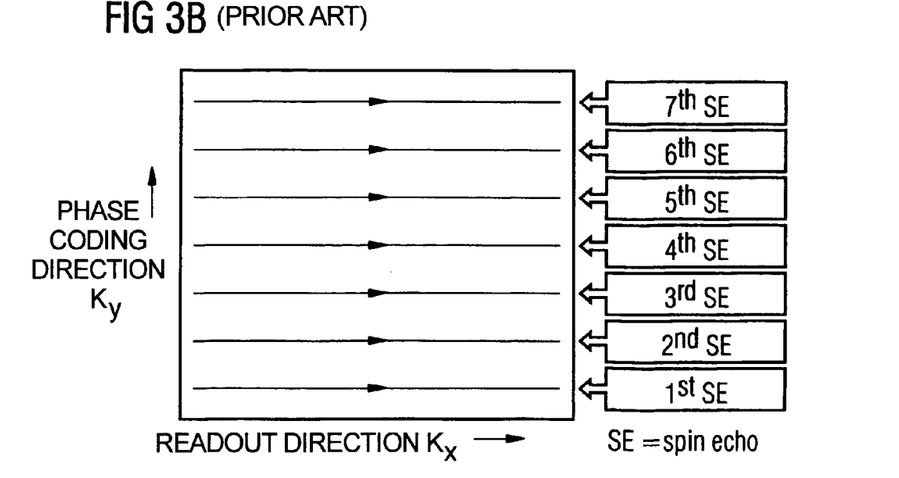
FIG. 3B schematically illustrates scanning of the k-matrix in a TSE or RARE sequence according to FIG. 3A.

The scanning of the k-matrix (k-matrices in the case of data from multiple slices) typically requires, for spin-echo sequences with diagnostically usable image quality, several minutes of measurement time, which is a problem in many clinical applications. For example, patients cannot remain still for the required interval of time. In the case of examinations in the thorax or pelvic regions, movement of the anatomy is generally unavoidable (heart and respiratory movement, peristalsis). A way of speeding up spin-echo sequences was published in 1986 as the turbo spin-echo sequence (TSE sequence) or rather under the acronym RARE (Rapid Acquisition with Relaxation Enhancement) (J. Hennig et al., Magn. Reson. Med. 3, 823–833, 1986). In this imaging technique (which is much faster than the conventional spin-echo technique described above), after a 90° excitation pulse a plurality of multiple echoes are generated, each of these echoes being individually phase-coded. A corresponding sequence diagram is shown in FIG. 3A for the case in which respectively seven echoes are produced. Before and after each echo, the phase-coding gradient must be switched corresponding to the Fourier row to be selected. In this manner, after a single RF excitation pulse (90°) a row-by-row scanning of the k-matrix takes place, as is shown in FIG. 3B. The required overall measurement time is reduced in this example by a factor of seven. The signal function is shown in FIG. 3A in an idealized fashion. In reality, the later echoes have smaller and smaller amplitudes due to the decay of the cross magnetization T2.

An even faster imaging sequence is represented by a combination of RARE with Half-Fourier technology; this was presented in 1994 and is known as the HASTE sequence (Half-Fourier Acquired Single shot Turbo spin Echo) (B. Kiefer et al., J. Magn. Reson. Imaging, 4(P), 86, 1994). HASTE uses the same basic technology as RARE, but only a half of the k-matrix is scanned. The other half of the k-matrix is reconstructed computationally using a Half-Fourier algorithm. Here, one takes advantage of the fact that the data points of the k-matrix are arranged with mirror symmetry about the center point of the k-matrix. For this reason, it is sufficient to measure only the data points of a k-matrix half and then to computationally fill out the raw data matrix by mirroring with respect to the center point (and complex conjugation). In this manner, the measurement time can be reduced by half, but the reduction of the recording time is associated with a degradation of the signal-to-noise (S/N) ratio by a factor of $\sqrt{2}$.

Figure 4:
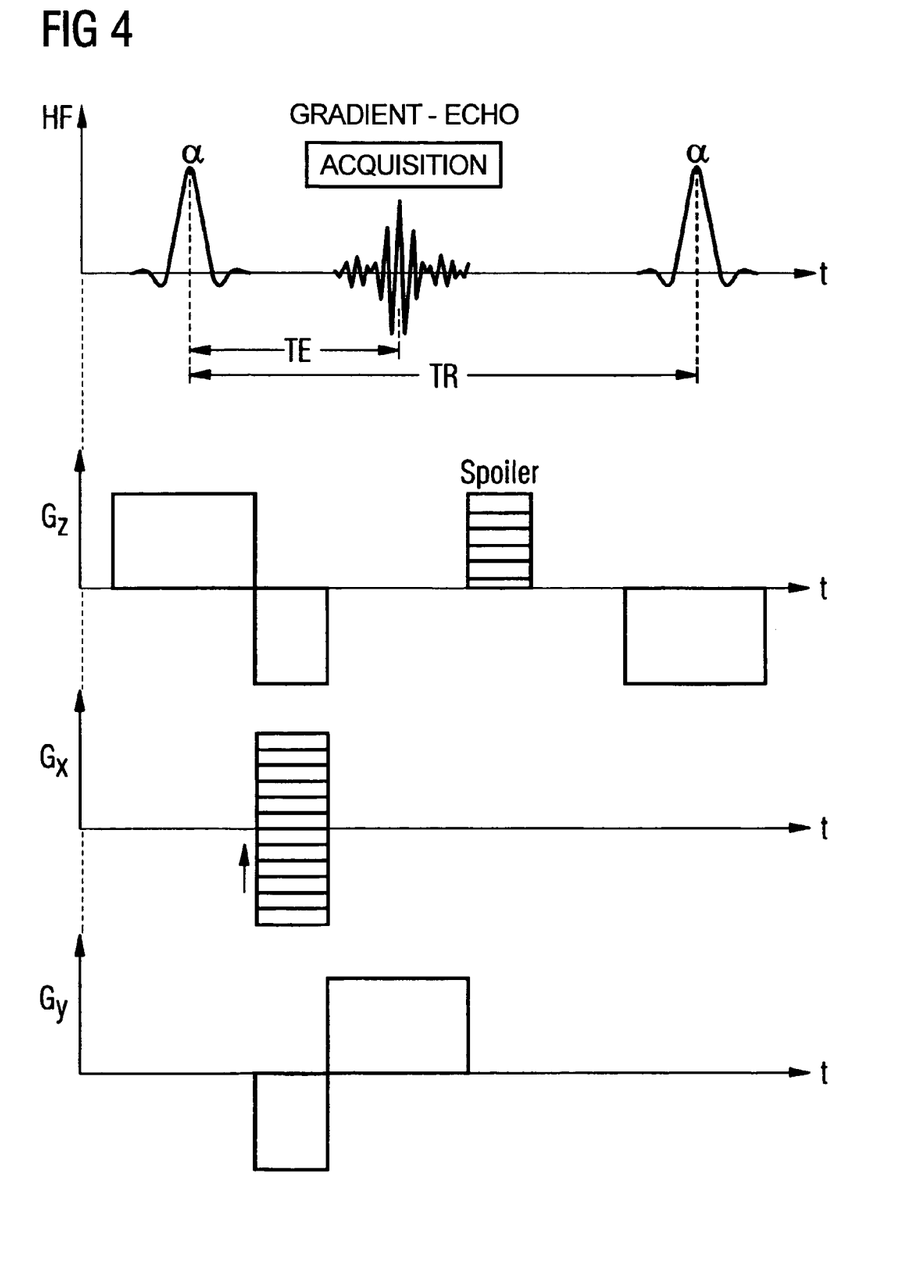
FIG. 4 schematically illustrates a conventional spoiled gradient echo sequence (FLASH sequence).

A further method of obtaining or scanning the k-matrix in a quick manner is a technique known as "gradient echo imaging" (GE imaging, GE sequence). The pulse and gradient pattern of a typical GE sequence is shown schematically in FIG. 4. As with the spin-echo sequences, here as well a rephasing in terms of the slice selection gradient Gz takes place and a pre-dephasing in terms of the frequency coding gradient Gy. Due to this gradient switching, the dephasing of the cross magnetization caused by the gradients is compensated so that an echo signal arises which is known as "gradient echo" (GE). Sequences in which the echo signal is generated exclusively through gradient inversion are known as gradient echo sequences (GE sequences).

In contrast to spin-echo sequences, the nomenclature for GE sequences is not consistent, and varies from company to company. The two most common GE sequences are known as the FLASH sequence ("Fast Low Angle SHot") and the FISP sequence ("Fast Imaging with Steady Precession"). The two differ only in that the cross magnetization in the FLASH sequence is spoiled after data acquisition (using a spoiler gradient) ("spoiled GE sequence") whereas it is maximized in the FISP sequence ("refocused GE sequence"). The GE sequence in FIG. 4 thus represents a FLASH sequence with the spoiler gradient.

In MRT imaging using spin-echo sequences as well as when using GE sequences, there is the general problem that the resonance condition during the radio-frequency excitation by the HF pulse exists not only in the field of view (FOV, characterized by homogeneity of the basic field as well as the gradient fields) but also in the non-homogeneous boundary region of the FOV. This means that superimposed on the image of the actual measurement field is a generally disruptive image from the inhomogeneity region in the form of an artifact. This undesired artifact is known as an "ambiguity" artifact. The ambiguity artifact becomes more pronounced the shorter the extent of the basic field magnet in the z direction.

Heretofore, the ambiguity artifact could be suppressed only in spin-echo sequences but not in gradient echo sequences. U.S. Patent Application Publication No. 2002/0101237 describes suppression thereof (unlike the conventional slice excitation of an spin-echo sequence) by switching the slice selection gradient during the slice excitation by the (90°) RF pulse, in comparison to the slice selection gradient which is switched during the (180°) refocusing pulse, with inversion in terms of its sign (polarity). This results in the resonance condition of the 90° pulse being fulfilled outside of the FOV at a different spatial position from the resonance condition when using the 180° pulse with the inverted sign. The ambiguity artifact cannot arise because the magnetization excited outside of the FOV is not refocused. A technique for suppressing the ambiguity artifacts in GE sequences is currently not known.

SUMMARY OF THE INVENTION

An object of the present invention is thus to provide an imaging method for magnetic resonance tomography wherein the occurrence of the ambiguity artifact is avoided without impairing the measurement duration and the signal-to-noise ratio, not only when using spin-echo sequences but also when using GE sequences.

This object is achieved according to the invention by a method for magnetic resonance imaging wherein suitable combined switching of the radio-frequency excitation pulses, slice selection gradient pulses, phase-coding gradient pulses and readout gradient pulses, a matrix in k-space is scanned row-by-row and transformed using a Fourier transformation into a matrix in the spatial domain, and wherein the polarity of the slice selection gradient is inverted during the scanning of the k-matrix. Here, in each case the polarity of the slice selection gradient is inverted with respect to the k-space rows.

Unlike conventional methods, an inversion of the slice selection gradient is not carried out within the scanning of each k-space row (e.g., in the case of a spin-echo sequence: positive polarity during the 90° excitation pulse and negative polarity of the 180° refocusing pulse, both within a k-space row), but instead from k-space row to k-space row, or from k-space matrix region to k-space matrix region. In the case of the spin-echo sequence that was just presented, this means, for example, positive polarity during the 90° excitation pulse and negative polarity of the 180° refocusing pulse within the first k-space row; negative polarity during the 90° excitation pulse and positive polarity of the 180° refocusing pulse within the second k-space row; etc. All possible combinations in terms of the polarity and inversion are conceivable.

In a first embodiment the polarity of the slice selection gradient can be inverted from one k-space row to the next in a row-by-row manner.

It is then advantageous to conduct the transformation of the k-matrix with a parallel imaging technology (SMASH, SENSE, GRAPPA) in the sense that a first image is reconstructed from the even rows and a second image from the odd rows of the k-matrix.

In a possible embodiment, the polarity of the slice selection gradient can be inverted from one half of the k-matrix to the next half of the k-matrix.

It is then advantageous to realize the transformation of the k-matrix with Half-Fourier technology in the sense that a first image is reconstructed from the first half of the k-matrix and a second image from the second half of the k-matrix.

The method according to the invention can be used in gradient echo sequences by the combined switching of radio-frequency excitation pulses, slice selection gradient pulses, phase-coding gradient pulses and readout gradient pulses forming a gradient echo sequence, as well as in spin-echo sequences by the combined switching of radio-frequency excitation pulses, slice selection gradient pulses, phase-coding gradient pulses and readout gradient pulses forming a spin-echo sequence.

In both cases, artifact-free image information for the respective image can be obtained according to the invention by correlation analysis from a first image and a second image.

Advantageously, the two artifact-free images can be added together in order to compensate for the signal-to-noise loss.

Moreover, within the context of the correlation analysis, the image of the k-matrix transformed on the basis of all of the k-space rows can be considered.

The above object also is achieved according to the invention by a magnetic resonance tomography apparatus, having gradient amplifiers with associated gradient coils, an input display terminal, a sequence controller and a system computer as well as an analog/digital converter which implements the embodiments of the method described above.

DESCRIPTION OF THE PREFERRED EMBODIMENTS

Figure 1:
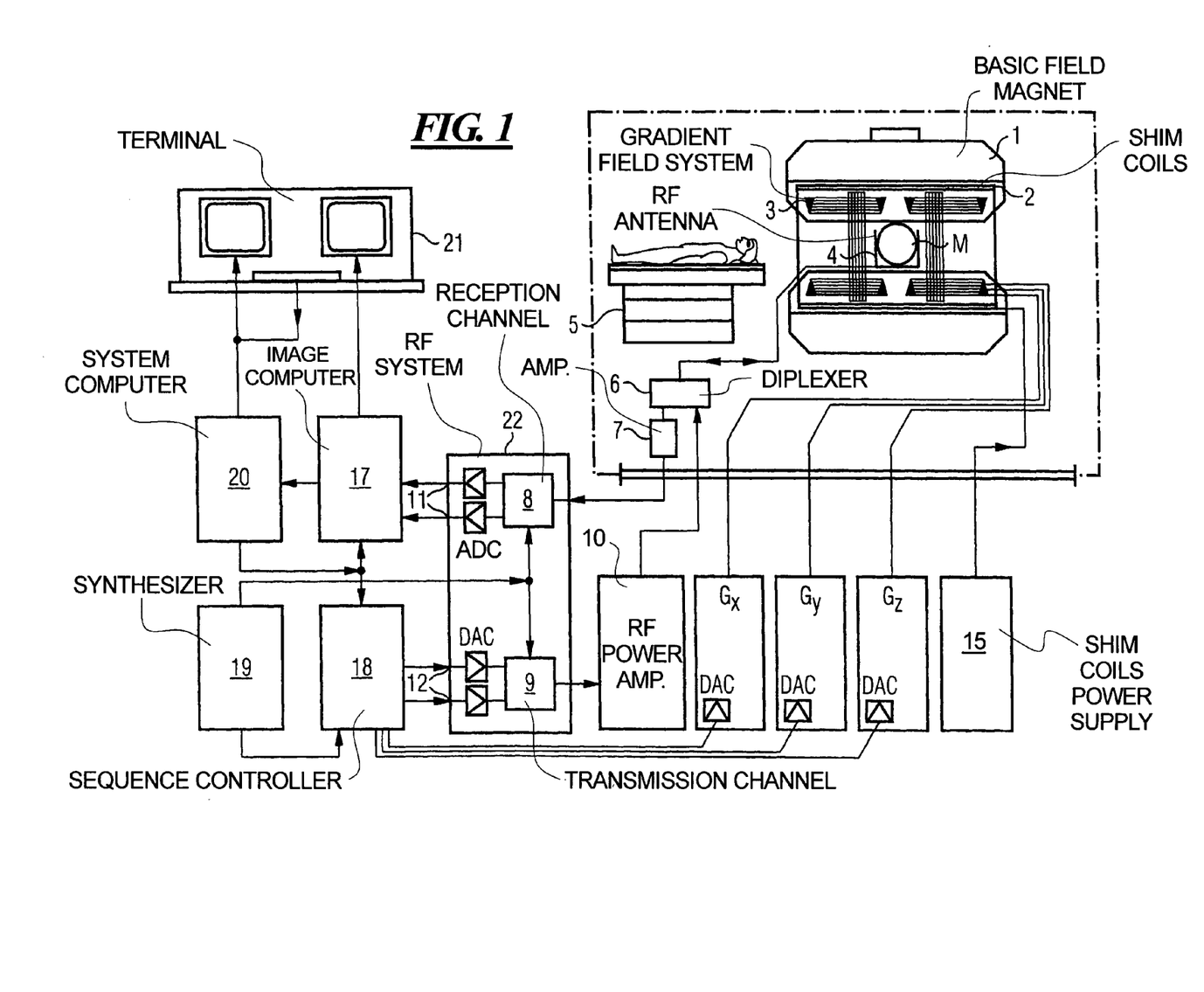
FIG. 1 schematically illustrates an MRT apparatus constructed and operating according to the invention.

FIG. 1 schematically shows MRT apparatus for generating gradient pulses according to the prevent invention. The basic design of the nuclear spin tomography instrument corresponds here to the design of a conventional tomography apparatus with the exceptions described below. A basic field magnet 1 produces a strong magnetic field which is constant over time for polarization or alignment of the nuclear spins in the examination region of a subject, e.g., a part of a human body being examined. The high homogeneity of the basic magnetic field required for the magnetic resonance measurement is defined in a spherical measurement volume M into which the parts of the human body under examination are introduced. To support the homogeneity requirements and particularly to eliminate influences that are invariable over time, "shim plates" made of a ferromagnetic material are arranged at suitable locations. Influences that are variable over time are eliminated by shim coils 2 that are controlled by a shim power supply 15.

A cylindrical gradient coil system 3 is disposed in the basic field magnet 1, formed by three coils. The coils are supplied with power by respective amplifiers 14 to produce linear gradient fields in the respective directions of the Cartesian coordinate system. Here, the first coil of the gradient field system 3 produces a gradient $G_x$ in the x direction, the second coil a gradient $G_y$ in the y direction, and the third coil a gradient $G_z$ in the z direction. Each amplifier 14 includes a digital/analog converter which is controlled by a sequence controller 18 in order to produce gradient pulses with the proper timing.

Within the gradient field system 3, there is a radio-frequency antenna 4 which converts the radio-frequency pulses emitted by a radio-frequency power amplifier 30 into an alternating magnetic field for exciting the nuclei and aligning the nuclear spins of the subject to be examined or rather the region of the subject to be examined. The alternating field emanating from the precessing nuclear spins, i.e., in general the nuclear spin echo signals caused by a pulse sequence consisting of one or more of radio-frequency pulses and one or more of gradient pulses, is also converted by the radio-frequency antenna 4 into a voltage that is fed via an amplifier 7 to a radio-frequency receiving channel 8 of a radio-frequency system 22. The radio-frequency system 22 includes, moreover, a transmitting channel 9 in which the radio-frequency pulses for the excitation of the magnetic resonance are produced. Here, the respective radio-frequency pulses are represented digitally based on a pulse sequence specified by the system computer 20 in the sequence controller 18, as a sequence of complex numbers. This sequence of numbers is fed as real and imaginary parts via respective inputs 12 to a digital/analog converter in the radio-frequency system 22 and there to a transmitting channel 9. In the transmitting channel 9, the pulse sequences are modulated on a radio-frequency carrier signal having a base frequency corresponding to the resonance frequency of the nuclear spins in the measurement volume.

The switching between transmitting to receiving modes takes place via a diplexer 6. The radio-frequency antenna 4 emits the radio-frequency pulses for exciting the nuclear spins into the measurement volume M and scans the resulting echo signals. The nuclear resonance signals obtained in this manner are demodulated in the receiving channel 8 of the radio-frequency system 22 in a phase-sensitive manner and are converted via respective analog/digital converters into the real part and imaginary part of the measurement signal. In an image processor 17, an image is reconstructed based on the measurement data obtained in this manner. The management of the measurement data, the image data and the control programs takes place via the system computer 20. Based on an input with control programs, the sequence controller 18 controls the generation of the respectively desired pulse sequences and the corresponding scanning of k-space. In particular, the sequence controller 18 controls, in accordance with the invention, the switching with the proper timing of the gradients, the emission of the radio-frequency pulses with a defined phase and amplitude as well as the reception of the magnetic resonance signals. The timing base for the radio-frequency system 22 and the sequence controller 18 is provided by a synthesizer 19. The selection of corresponding control programs for generating a magnetic resonance image as well as the display of the generated image take place at a terminal 21, which includes a keyboard as well as one or more screens.

The present invention involve the generation of an innovative RF excitation pattern in combination with a subsequent image reconstruction method that is specially coordinated with it. The sequence function according to the function is generated in the sequence controller 18 or in the system computer 20. The image reconstruction takes place likewise in the system computer 20. Basically, according to the invention in the measurement or the scanning of the k-matrix, individual rows or regions of the k-matrix are coded differently in order to generate in this manner ambiguity artifacts which originate from different regions and accordingly in the spatial domain (i.e., in the image that is reconstructed later) are separated and displayed in a non-overlapping manner. The coding takes place by the appropriate polarity of the slice selection gradient during the RF excitation. The elimination of the ambiguity artifacts takes place, e.g., by a correlation analysis of the two images which have been reconstructed from in each case differently coded k-matrix regions.

Figure 5:
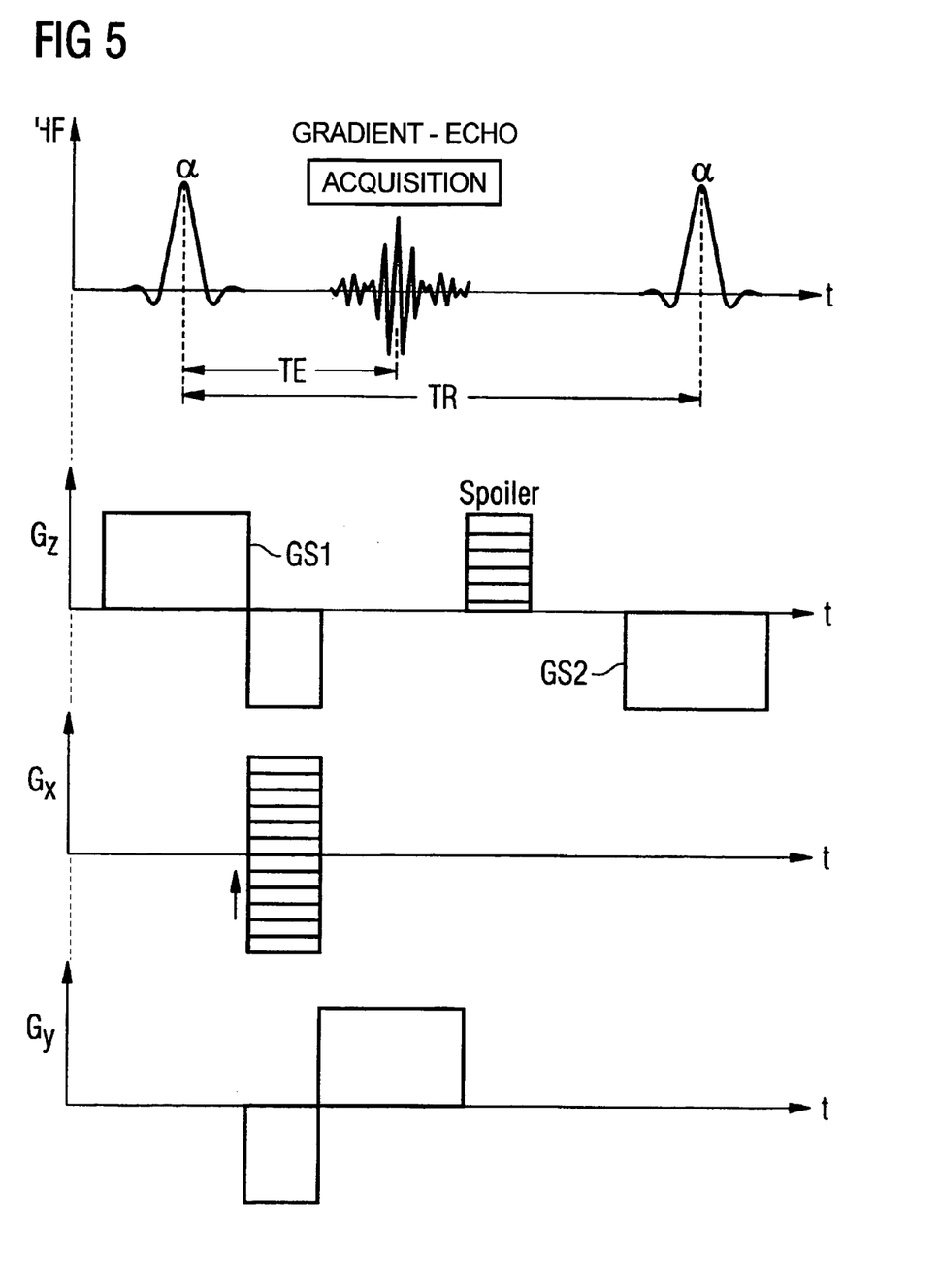
FIG. 5 schematically illustrates a GE sequence according to the invention (FLASH sequence) in which the even and odd rows of the k-matrix are acquired with different polarity of the slice selection gradient (Gz or GS).

The invention is explained below based on two exemplary embodiments:

The sequence diagram of a first embodiment of the invention is shown in FIG. 5. The sequence according to the invention in this example is a gradient echo sequence (FLASH sequence). In the topmost row, an initial a excitation pulse (RF excitation pulse) is shown while simultaneously a positive slice selection gradient GS1 is switched. As in a conventional FLASH sequence, the phase-coding takes place subsequently during in this case a negatively switched slice selection and readout gradient. Due to the also subsequently positively switched readout gradient (currently TE after transmitting the RF excitation pulse), the gradient echo is generated and read out using an analog/digital converter (ADC). In this manner, the first k-space row is acquired. Finally, the remaining cross magnetization is spoiled by a spoiler gradient in the slice selection direction.

Figure 7A:
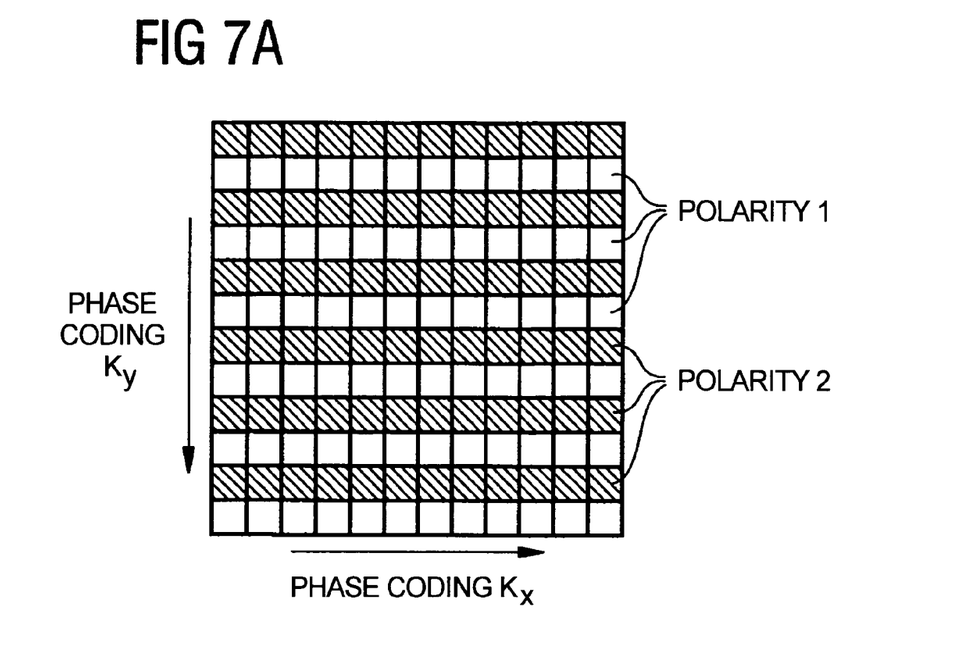
FIG. 7A schematically illustrates a k-matrix, the even and odd rows of which are coded and read-out with different polarity of the slice selection gradient in accordance with the invention.

The next sequence repetition (for measuring the second k-space row) starts again with an RF excitation pulse α (same flip angle α). In comparison to the first sequence, the gradient amplitude of the slice selection gradient pulse GS2, which is switched simultaneously to the RF excitation pulse is inverted. Thus, the slice selection gradient of the second sequence repetition is negative. The remaining part of this second sequence repetition (no longer shown) corresponds (except for the different phase-coding) again to that of the first sequence. The further following sequence repetitions differ (except for the different phase-coding) in the alternating sign of the amplitude of the slice selection gradient. In this manner (as shown in FIG. 7a), the shaded even-numbered k-space rows and the unshaded odd-numbered k-space rows are acquired with, in each case, a different sign (polarity 1 and polarity 2) of the amplitude of the slice selection gradient (in this example the even-numbered k-space rows with a negative slice selection gradient, the odd-numbered k-space rows with a positive slice selection gradient). This results in the fact that when using the first (positive) gradient amplitude GS1 of the slice selection gradient, the undesired excitation out of the boundary region of the FOV takes place at a different location in the inhomogeneity region than for subsequent usage of the inverted (negative) gradient amplitude GS2 of the slice selection gradient.

Figure 6:
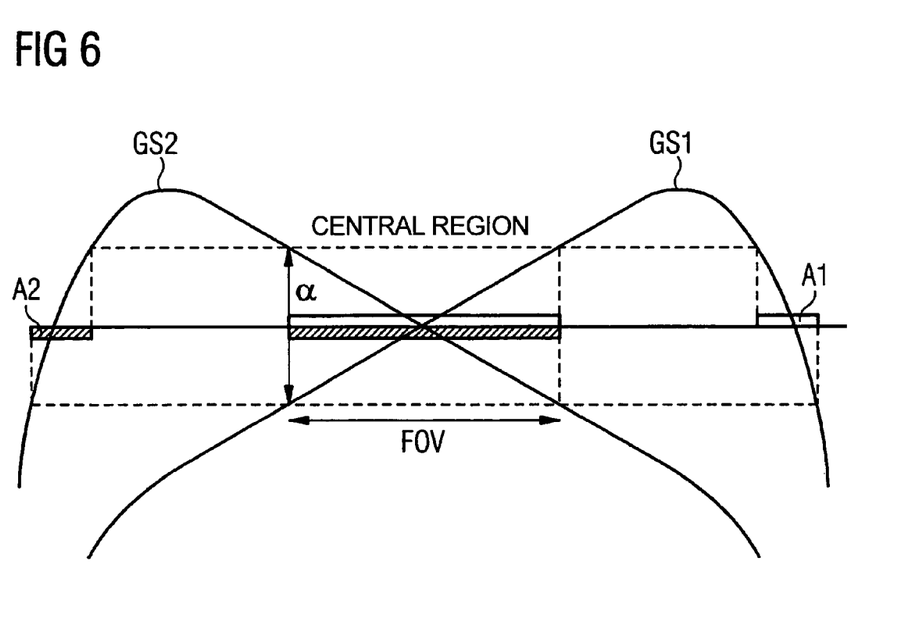
FIG. 6 schematically illustrates the superimposition of the basic field and gradient field for two polarities of the slice selection gradient by which the ambiguity artifacts of different regions of the k-matrix (even and odd rows or rather first and second half of the k-matrix) occur at different regions in the spatial domain in accordance with the invention.

FIG. 6 provides a further explanation. The gradient fields GS1 and GS2 of the slice selection gradient which are superimposed in successive sequence passes on the basic field are shown. The gradient functions are linear in the central region (particularly in the region of the FOV), but they are highly nonlinear in the boundary regions on both sides. This results in the fact that in both boundary regions (on the left and right sides) within the excitation band indicated with a dashed line (region in which the spin resonance condition is fulfilled) but outside of the FOV and thus in an undesirable manner resonance signals are acquired. Due to the inverted polarity of the slice selection gradients GS1 and GS2, in each case undesired excitation takes place but at different locations in the inhomogeneity region. In the example in FIG. 6, the inhomogeneity of GS1 causes a resonance signal in the unshaded region A1 on the right side whereas the inhomogeneity of GS2 results in a resonance signal in the shaded region A2 on the left side. The excitation out of both regions A1 and A2 causes ambiguity artifacts in the reconstructed image which are shifted relative to the actual image by N/2 (N is the number of k-space rows) but do not intersect or overlap. Due to a positive slice selection gradient, resonance in A1 causes an ambiguity artifact at a first position in the image, and due to a negative slice selection gradient, resonance in A2 causes an ambiguity artifact at a second position (different from the first) in the image. The image reconstructed in this manner and containing both ambiguity artifacts shifted by N/2 can be used optionally to compute the actual artifact-free image.

In the case of the k-space rows being acquired with alternating polarity in each case, it becomes possible to determine the actual image using parallel image reconstruction techniques such as SENSE or SMASH. This step presumes that corresponding multi-element array coils were used. Using parallel image reconstruction, an image can be computed from the odd raw data rows and in each case an image from the even raw data rows. These two images now show depending on the polarity of the slice selection gradient in each case only one or the other ambiguity artifact. Using correlation analysis, the image information which differs in the images (meaning the ambiguity artifacts) can be extracted from these two images. To make the method more robust (as was already mentioned), additionally that image or the image information from that image can still be used which contains the artifacts shifted by N/2. Subsequently, the images obtained with parallel image reconstruction can be added so that the signal-to-noise loss caused by the parallel image reconstruction can be compensated.

Figure 7B:
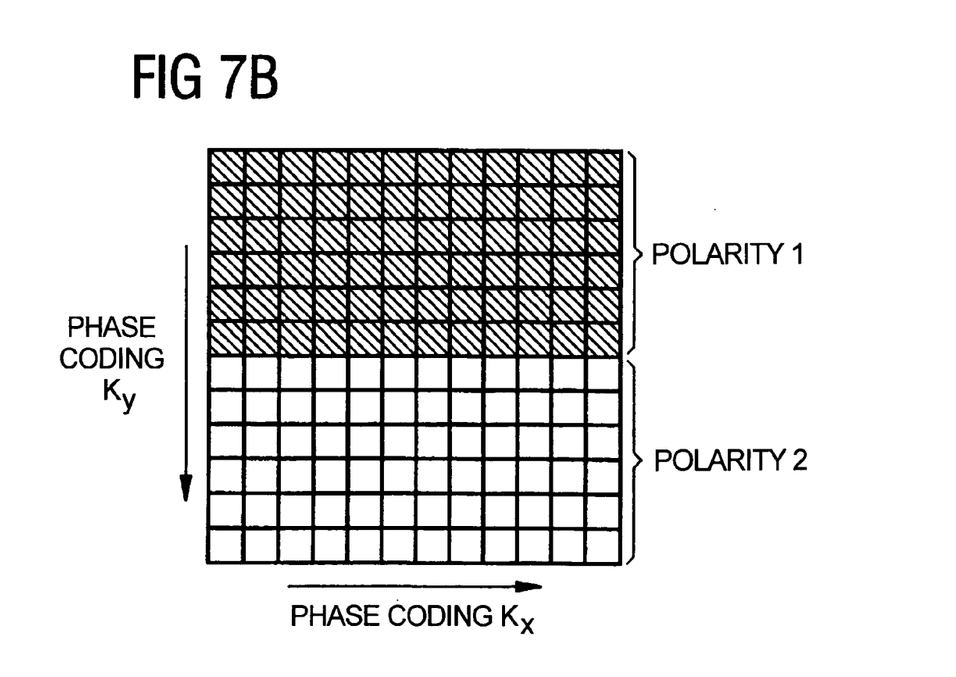
FIG. 7B schematically illustrates a k-matrix, the first and second halves of which are coded and read-out with different polarity of the slice selection gradient in accordance with the invention.

Instead of changing the polarity of the slice selection gradient in the capture of every second raw data row, within a raw data set associated with a slice position also other sequences of the polarity change can take place. Thus, in a second exemplary embodiment of the invention (shown in FIG. 7B), the polarity 1 (e.g., positive) can be used for acquiring data for the first half of the scanned k-space rows of the raw data matrix (shaded region), and the polarity 2 (negative, unshaded region) can be used for the acquiring data for the second half of the scanned k-space rows of the raw data matrix. Using, say, a Half-Fourier technique (as described above), on the basis of the symmetry of the k-matrix the complete image is reconstructed from the first (shaded) half of the raw data matrix. The same takes place for the data from the second half (unshaded region) of the raw data matrix. In the two images obtained in this manner, the ambiguity artifact will appear in a non-overlapping manner at two different positions in the reconstructed image. Using, for example, correlation analysis, in this manner from these two images the image information which differs in the two images (meaning the ambiguity artifacts) can be extracted. The images obtained from the two Half-Fourier reconstructions can be added afterwards so that the signal-to-noise loss caused by the Half-Fourier reconstruction is compensated.

In summary, the MRT imaging sequence according to the invention presents the occurrence of the ambiguity artifact both in SE sequences and in GE sequences by inversion of the gradient amplitude of the slice selection gradient in gradient echo sequences as well as, additionally, inversion of the refocusing pulse in spin-echo sequences in the acquisition of certain rows of the k-matrix and special reconstruction of the data.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for magnetic resonance imaging comprising the steps of:
   generating a combined sequence of switched radio-frequency excitation pulses, slice selection gradient pulses having respective polarities, phase-encoding gradient pulses and readout gradient pulses for producing a matrix in k-space having a plurality of rows, each row corresponding to a phase-encoding step associated with one of said phase-encoding gradient pulses;
   scanning said matrix with inversion, after a predetermined number of phase-encoding steps, of the respective polarities of the slice selection gradient pulses; and
   transforming said matrix in k-space into a matrix in the spatial domain by Fourier transformation.

2. A method as claimed in claim 1 comprising inverting the respective polarities of the slice selection gradient pulses row-by-row from one row of said matrix to a next row of said matrix.

3. A method as claimed in claim 2 comprising transforming said matrix in k-space using a parallel imaging technique by reconstructing a first image from even rows of the matrix and reconstructing a second image from odd rows of the matrix.

4. A method as claimed in claim 1 comprising inverting the respective polarities of the slice selection gradient pulses from a first half of the matrix to a second half of the matrix.

5. A method as claimed in claim 4 comprising transforming the matrix in k-space using a half-Fourier technique by reconstructing a first image from the first half of the matrix and reconstructing a second image from the second half of the matrix.

6. A method as claimed in claim 1 comprising controlling said combined switching of said radio-frequency excitation pulses, said slice selection gradient pulses, said phase-encoding gradient pulses and said readout gradient pulses to form a gradient echo sequence.

7. A method as claimed in claim 1 comprising controlling said combined switching of said radio-frequency excitation pulses, said slice selection gradient pulses, said phase-coding gradient pulses and said readout gradient pulses to form a spin-echo sequence.

8. A method as claimed in claim 1 comprising transforming the matrix in k-space into a first image in the spatial domain and a second image in the spatial domain, and performing correlation analysis on first and second images for obtaining artifact-free image data.

9. A method as claimed in claim 8 comprising adding said first and second images for compensating for signal-to-noise loss.

10. A method as claimed in claim 8 comprising, in said correlation analysis, using an image in the spatial domain transformed from all of the rows of the matrix in k-space.

11. A magnetic resonance tomography apparatus comprising:
    a magnetic resonance scanner having an RF system for generating radio-frequency excitation pulses, a gradient coil system for generating slice selection gradient pulses having respective polarities, phase-encoding gradient pulses and readout gradient pulses;
    a control unit for operating said scanner for combined switching of said radio-frequency excitation pulses, said slice selection gradient pulses, said phase-coding gradient pulses and said readout gradient pulses for generating a matrix in k-space, each row corresponding to a phase-encoding step associated with one of said phase-encoding gradient pulses, with said matrix being scanned row-by-row with the respective polarities of the slice selection gradient pulses being inverted after a predetermined number of phase-encoding steps; and
    an image computer for transforming said matrix in k-space into a matrix in the spatial domain by Fourier transformation.

12. An apparatus as claimed in claim 11 wherein said control unit inverts the respective polarities of the slice selection gradient pulses row-by-row from one row of said matrix to a next row of said matrix.

13. An apparatus as darned in claim 12 wherein said image computer transforms said matrix using parallel imaging technology by reconstructing a first image from even rows of said matrix and reconstructing a second image from odd rows of said matrix.

14. An apparatus as claimed in claim 11 wherein said control unit inverts the respective polarities of the slice selection gradient pulses from a first half of the matrix to a second half of the matrix.

15. An apparatus as claimed in claim 14 wherein said image computer transforms said matrix in k-space using a half-Fourier technique by reconstructing a first image from the first half of the matrix and reconstructing a second image from the second half of the matrix.

16. An apparatus as claimed in claim 11 wherein said control unit implements combined switching of said radio-frequency excitation pulses, said slice selection gradient pulses, said phase-encoding gradient pulses and said readout gradient pulses as a gradient echo sequence.

17. An apparatus as claimed in claim 11 wherein said control unit implements combined switching of said radio-frequency excitation pulses, said slice selection gradient pulses, said phase-encoding gradient pulses and said readout gradient pulses as a spin-echo sequence.

18. An apparatus as claimed in claim 11 wherein said image computer reconstructs a first image from said matrix in k-space and reconstructs a second image from said matrix in k-space, and obtains artifact-free image information by correlation analysis of said first and second images.

19. An apparatus as claimed in claim 18 wherein said image computer adds said first and second images for compensating for signal-to-noise loss.

20. An apparatus as claimed in claim 18 wherein said image computer, in said correlation analysis, employs an image in the spatial domain obtained by transforming all rows of said matrix in k-space.

* * * * *